(12) United States Patent
Tsai et al.

(10) Patent No.: US 12,405,529 B2
(45) Date of Patent: Sep. 2, 2025

(54) LITHOGRAPHY SYSTEM AND METHODS

(71) Applicant: Taiwan Semiconductor Manufacturing Co., Ltd., Hsinchu (TW)

(72) Inventors: Cheng Hung Tsai, Hsinchu (TW); Sheng-Kang Yu, Hsinchu (TW); Shang-Chieh Chien, Hsinchu (TW); Heng-Hsin Liu, Hsinchu (TW); Li-Jui Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 140 days.

(21) Appl. No.: 18/446,400

(22) Filed: Aug. 8, 2023

(65) Prior Publication Data

US 2023/0400763 A1 Dec. 14, 2023

Related U.S. Application Data

(62) Division of application No. 17/232,483, filed on Apr. 16, 2021, now Pat. No. 12,287,572.

(51) Int. Cl.
*G03F 7/00* (2006.01)
*G03F 7/20* (2006.01)
(Continued)

(52) U.S. Cl.
CPC .......... *G03F 7/0035* (2013.01); *G03F 7/2004* (2013.01); *G03F 7/2026* (2013.01); *G03F 7/22* (2013.01); *G03F 7/36* (2013.01)

(58) Field of Classification Search
CPC .... G03F 7/0035; G03F 7/2004; G03F 7/2026; G03F 7/22; G03F 7/36; G03F 7/70033;
(Continued)

(56) References Cited

U.S. PATENT DOCUMENTS 9,465,208 B2 10/2016 Vogt et al.
9,541,840 B2 1/2017 Brandt et al.
(Continued)

FOREIGN PATENT DOCUMENTS

KR 20070032230 A 3/2007
WO WO 2014170093 A2 10/2014

OTHER PUBLICATIONS

Anthony, Frank M. "High heat load optics: an historical overview." Optical Engineering 34(2) (Feb. 1995): 313-320.

*Primary Examiner* — Mark F. Huff
*Assistant Examiner* — Moriah S. Smoot
(74) *Attorney, Agent, or Firm* — Seed Intellectual Property Law Group LLP

(57) ABSTRACT

A method includes: depositing a mask layer over a substrate; directing first radiation reflected from a central collector section of a sectional collector of a lithography system toward the mask layer according to a pattern; directing second radiation reflected from a peripheral collector section of the sectional collector toward the mask layer according to the pattern, wherein the peripheral collector section is vertically separated from the central collector section by a gap; forming openings in the mask layer by removing first regions of the mask layer exposed to the first radiation and second regions of the mask layer exposed to the second radiation; and removing material of a layer underlying the mask layer exposed by the openings.

20 Claims, 12 Drawing Sheets

(51) Int. Cl.
*G03F 7/22* (2006.01)
*G03F 7/36* (2006.01)

(58) Field of Classification Search
CPC ............ G03F 7/70175; G03F 7/70916; G03F 7/70975; G03F 7/203; G03F 7/70058; G21K 2201/067
See application file for complete search history.

(56) References Cited

U.S. PATENT DOCUMENTS

| | | |
|---|---|---|
| 10,635,002 B2 | 4/2020 | Brandt et al. |
| 2006/0000985 A1* | 1/2006 | Chandhok ............ G03F 7/70175 250/492.2 |
| 2008/0273235 A1* | 11/2008 | Cho .................... G02B 27/0025 359/226.1 |
| 2010/0051827 A1* | 3/2010 | Derra ................. G03F 7/70916 250/492.1 |
| 2013/0088697 A1* | 4/2013 | Labetski ............. G03F 7/70933 359/838 |
| 2013/0176614 A1 | 7/2013 | Anderl et al. |
| 2015/0261094 A1 | 9/2015 | Huang et al. |
| 2017/0097572 A1* | 4/2017 | Brandt .................... G21K 1/062 |
| 2017/0315453 A1 | 11/2017 | Bauer et al. |
| 2019/0166680 A1 | 5/2019 | Hsu et al. |
| 2020/0057393 A1 | 2/2020 | Yang et al. |
| 2020/0073250 A1 | 3/2020 | Zi et al. |

* cited by examiner

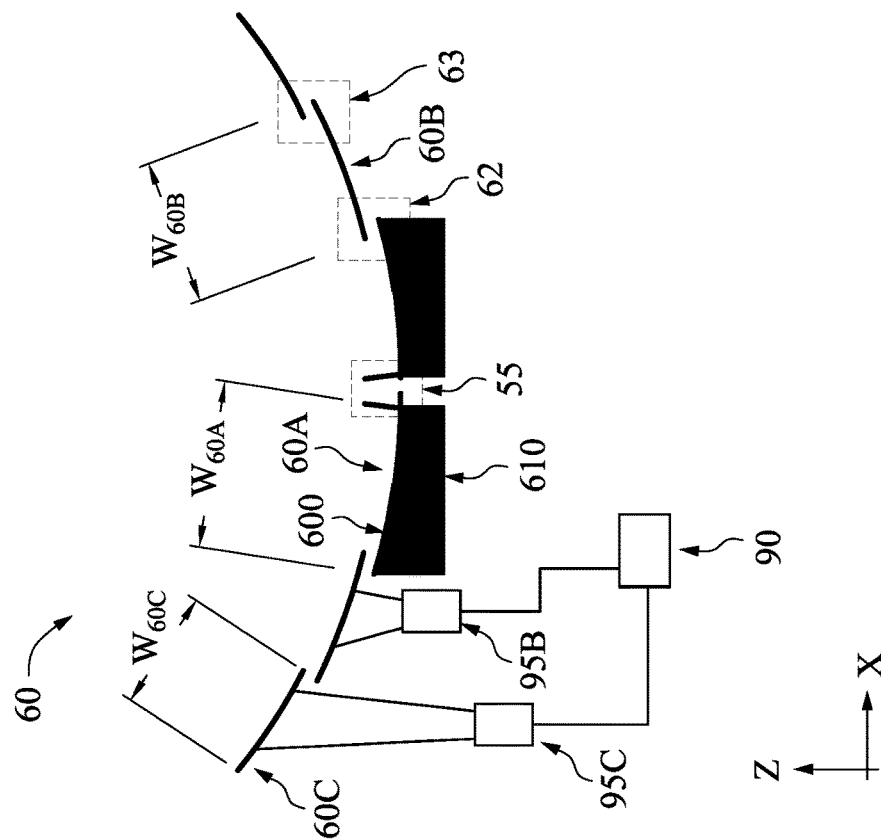
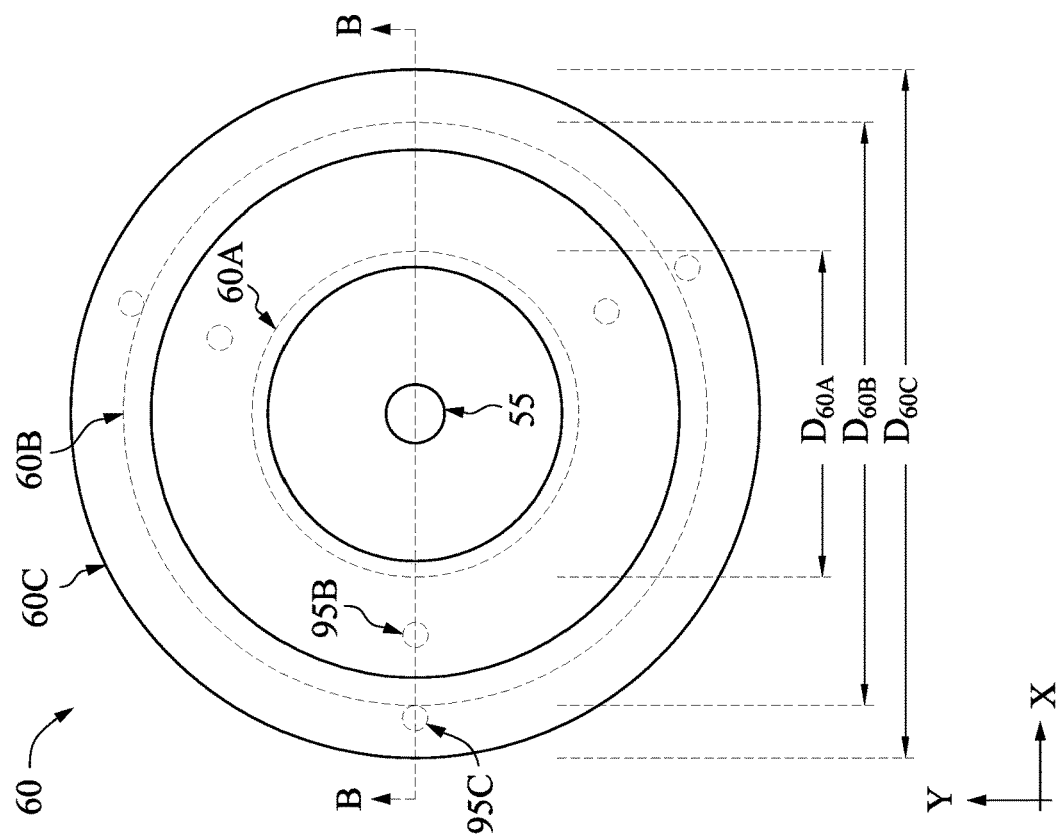
FIG. 2B
FIG. 2A

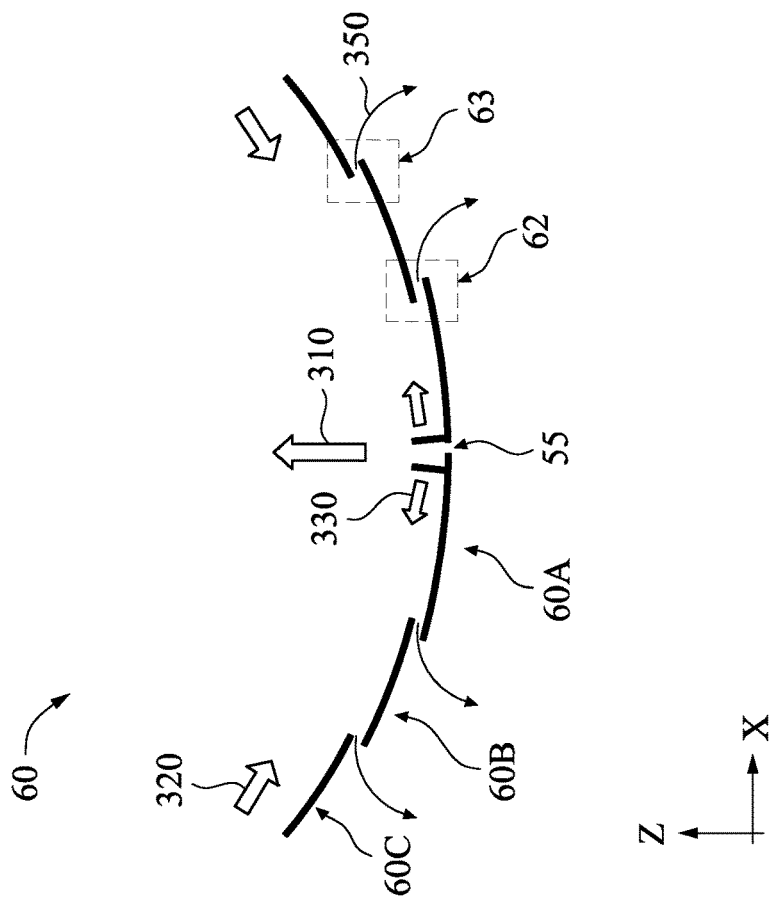
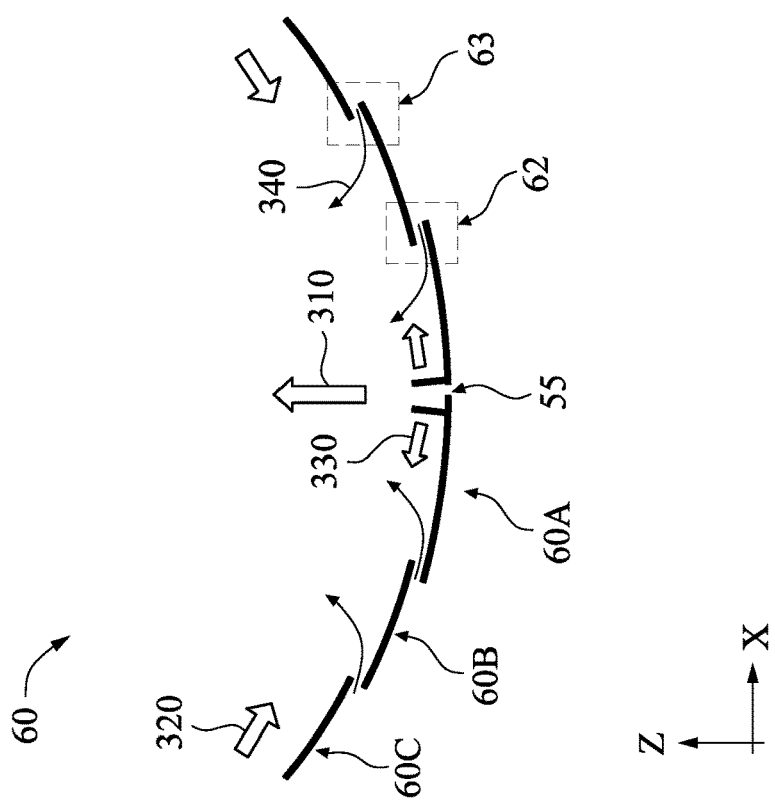
FIG. 3B
FIG. 3A

LITHOGRAPHY SYSTEM AND METHODS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-16 are views of portions of a lithography scanner according to embodiments of the present disclosure.

FIGS. 2A-2H are views of various embodiments of a sectional collector of the lithography scanner according to various aspects of the present disclosure.

FIGS. 3A-3E are views illustrating air flow in the sectional collector in accordance with various embodiments.

FIGS. 4-5 are views illustrating methods of fabricating a device according to various aspects of the present disclosure.

DETAILED DESCRIPTION

Figure 1A:
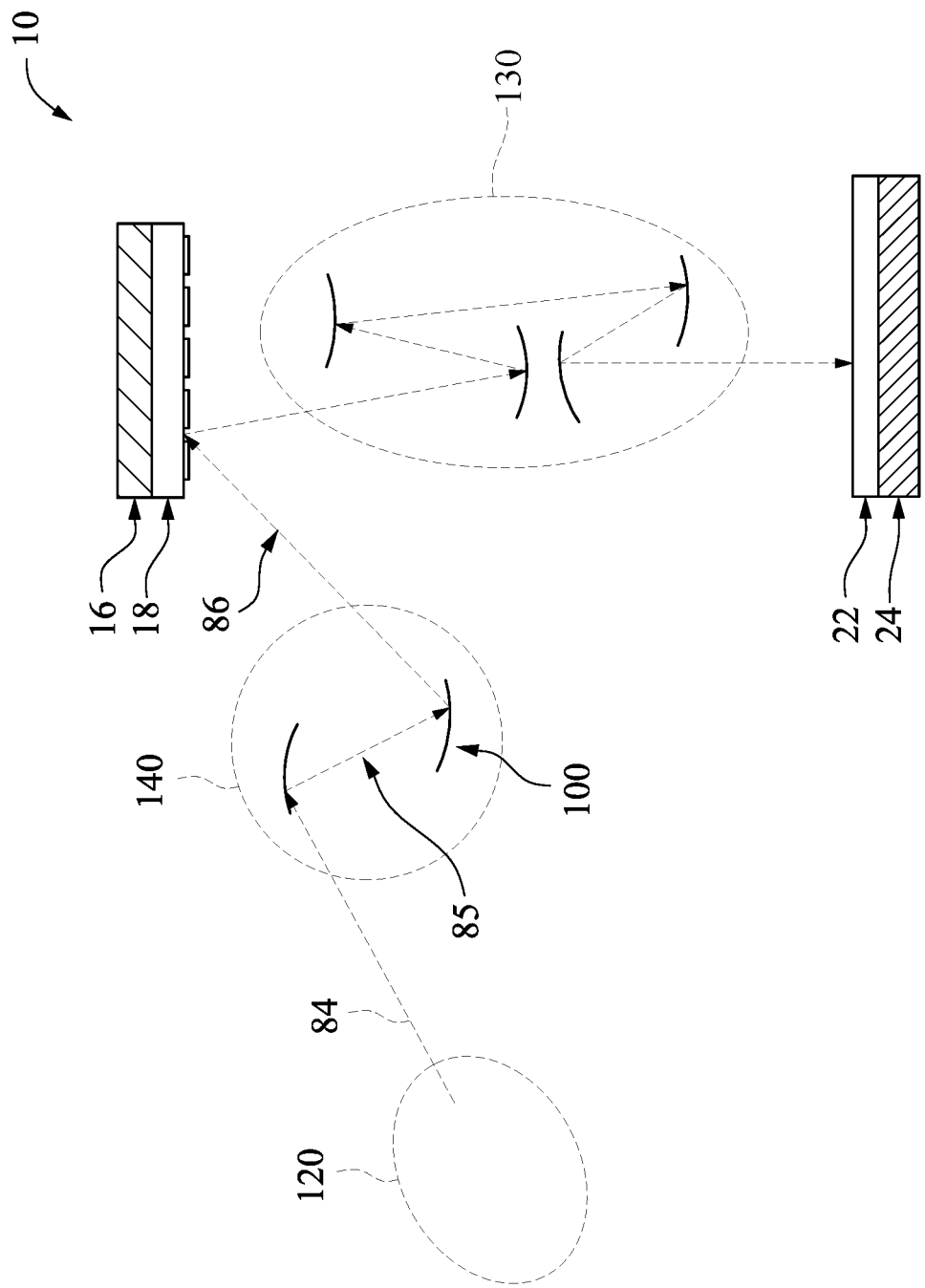

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

The present disclosure is generally related to lithography equipment for fabricating semiconductor devices, and more particularly to a sectional collector that is part of a light source. Dimension scaling (down) is increasingly difficult in advanced technology nodes. Lithography techniques employ ever shorter exposure wavelengths, including deep ultraviolet (DUV; about 193-248 nanometers), extreme ultraviolet (EUV; about 10-100 nanometers; particularly 13.5 nanometers), and X-ray (about 0.01-10 nanometers) to ensure accurate patterning at the scaled-down dimensions. EUV light is generated by a light source, and reflected toward a wafer by multiple mirrors and a reflective mask. Only a fraction of the EUV light reaches the wafer, such that increasing intensity of EUV light generated by the light source is a topic of much interest.

A typical EUV scanner includes a collector for focusing light scattered from a laser pulse incident on a droplet of material, such as tin. The collector includes a highly-polished mirror surface that is concave with a generally circular cross-section. In most configurations, the collector has an opening located at its center, and a light source, such as a laser, emits one or more laser pulses from behind the collector through the opening to strike the droplet as it traverses space in front of the collector. As EUV lithography advances, it becomes desirable for the collector to have increasingly large size to raise EUV conversion efficiency, which boosts wafer per day (WPD) throughput. Deformation of the collector as size increases due to collector weight impinges on ability to focus the EUV light. Tin contamination or buildup on the mirror surface of the collector is related to air flow over the collector surface, which can be difficult to maintain and control when the collector surface is large. Cost to manufacture a monolithic collector of very large dimensions with precise convex surface also increases significantly.

In the embodiments of this disclosure, a sectional collector with hierarchical structure is disclosed that enables enlargement of the collector size. The flow coverage is improved by gaps between collector sections to prevent tin buildup on the sectional collector. The modular design of the sectional collector with hierarchical structure is easier to maintain and lowers manufacturing cost.

FIG. 1A is a schematic and diagrammatic view of a lithography exposure system 10, in accordance with some embodiments. In some embodiments, the lithography exposure system 10 is an extreme ultraviolet (EUV) lithography system designed to expose a resist layer by EUV radiation, and may also be referred to as the EUV system 10. The lithography exposure system 10 includes a light source 120, an illuminator 140, a mask stage 16, a projection optics module (or projection optics box (POB)) 130 and a substrate stage 24, in accordance with some embodiments. The elements of the lithography exposure system 10 can be added to or omitted, and the disclosure should not be limited by the embodiment.

The light source 120 is configured to generate light radiation having a wavelength ranging between about 1 nm and about 100 nm in certain embodiments. In one particular example, the light source 120 generates an EUV radiation with a wavelength centered at about 13.5 nm. Accordingly, the light source 120 is also referred to as an EUV radiation source. However, it should be appreciated that the light source 120 should not be limited to emitting EUV radiation. The light source 120 can be utilized to perform any high-intensity photon emission from excited target fuel.

In various embodiments, the illuminator 140 includes various refractive optic components, such as a single lens or a lens system having multiple reflectors 100, for example lenses (zone plates) or alternatively reflective optics (for EUV lithography exposure system), such as a single mirror or a mirror system having multiple mirrors in order to direct light from the light source 120 onto the mask stage 16, particularly to a mask 18 secured on the mask stage 16. In the present embodiment where the light source 120 generates light in the EUV wavelength range, reflective optics are employed. In some embodiments, the illuminator 140 includes at least three lenses.

The mask stage 16 is configured to secure the mask 18. In some embodiments, the mask stage 16 includes an electrostatic chuck (e-chuck) to secure the mask 18. This is because gas molecules absorb EUV radiation and the lithography exposure system for the EUV lithography patterning is maintained in a vacuum environment to avoid EUV intensity loss. In the present disclosure, the terms mask, photomask, and reticle are used interchangeably. In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective multilayer deposited on the substrate.

The projection optics module (or projection optics box (POB)) 130 is configured for imaging the pattern of the mask 18 on to a semiconductor wafer 22 secured on the substrate stage 24 of the lithography exposure system 10. In some embodiments, the POB 130 has refractive optics (such as for a UV lithography exposure system) or alternatively reflective optics (such as for an EUV lithography exposure system) in various embodiments. The light directed from the mask 18, carrying the image of the pattern defined on the mask, is collected by the POB 130. The illuminator 140 and the POB 130 are collectively referred to as an optical module of the lithography exposure system 10. In some embodiments, the POB 130 includes at least six reflective optics.

In the present embodiment, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV radiation in the present embodiment. Various components including those described above are integrated together and are operable to perform lithography processes.

The lithography exposure system 10 may further include other modules or be integrated with (or be coupled with) other modules, such as a cleaning module designed to provide hydrogen gas to the light source 120. The hydrogen gas helps reduce contamination in the light source 120. Further description of the light source 120 is provided with reference to FIG. 1B.

Figure 1B:
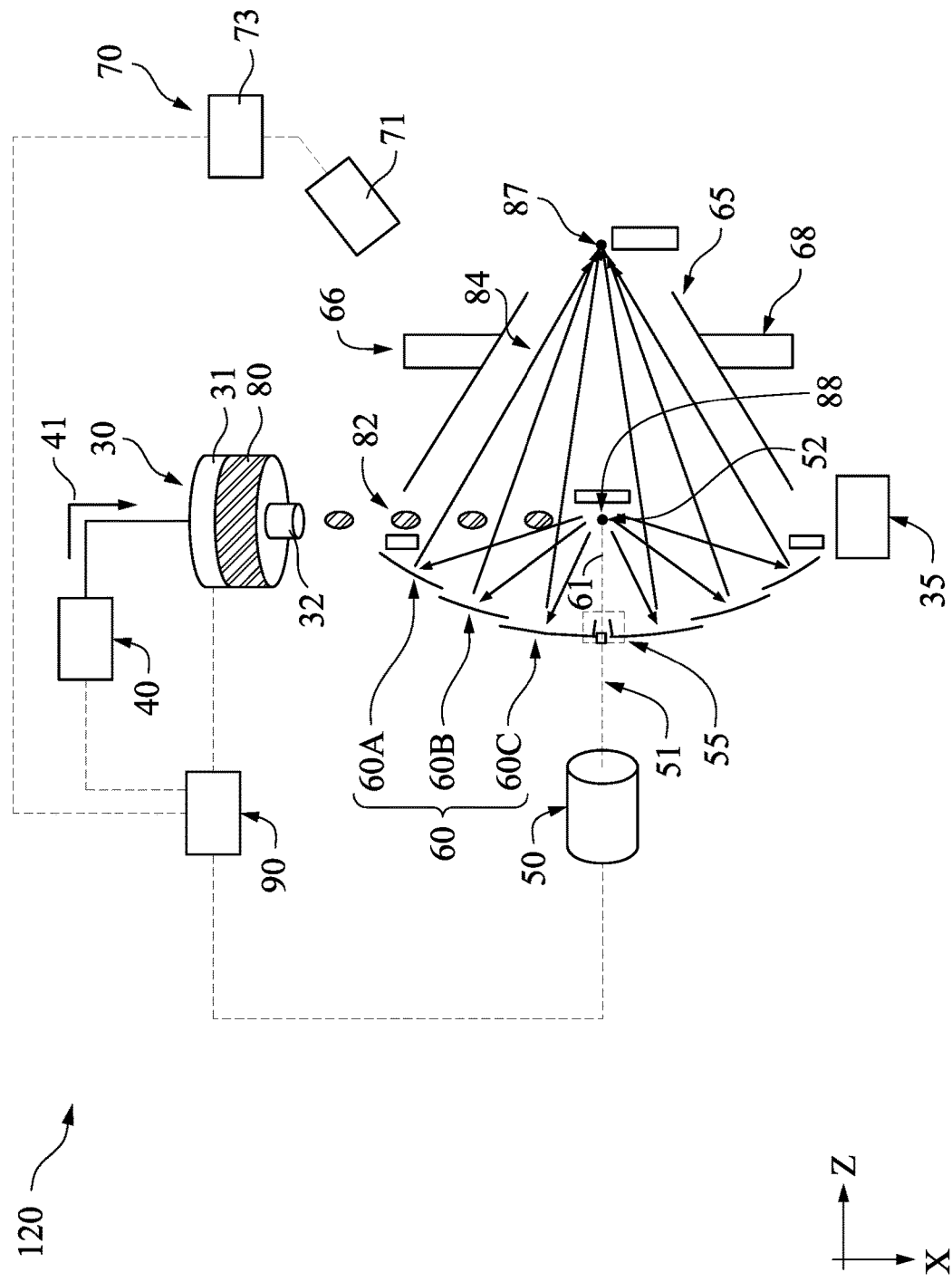

In FIG. 1B, the light source 120 is shown in a diagrammatical view, in accordance with some embodiments. In some embodiments, the light source 120 employs a dual-pulse laser produced plasma (LPP) mechanism to generate plasma 88 and further generate EUV radiation from the plasma. The light source 120 includes a droplet generator 30, a droplet receptacle 35, a laser generator 50, a laser produced plasma (LPP) collector 60 (also referred to as "sectional collector 60"), a monitoring device 70 and a controller 90. Some or all of the above-mentioned elements of the light source 120 may be held under vacuum. It should be appreciated that the elements of the light source 120 can be added to or omitted, and should not be limited by the embodiment.

The droplet generator 30 is configured to generate a plurality of droplets 82, which may be elongated, of a target fuel 80 to a zone of excitation at which at least one laser pulse 51 from the laser generator 50 hits the droplets 82 along an x-axis, as shown in FIG. 1B. In an embodiment, the target fuel 80 includes tin (Sn). In an embodiment, the droplets 82 may be formed with an elliptical shape. In an embodiment, the droplets 82 are generated at a rate of about 50 kilohertz (kHz) and are introduced into the zone of excitation in the light source 120 at a speed of about 70 meters per second (m/s). Other material can also be used for the target fuel 80, for example, a tin containing liquid material such as eutectic alloy containing tin, lithium (Li), and xenon (Xe). The target fuel 80 in the droplet generator 30 may be in a liquid phase.

The laser generator 50 is configured to generate at least one laser pulse to allow the conversion of the droplets 82 into plasma 88. In some embodiments, the laser generator 50 is configured to produce a laser pulse 51 to the lighting point 52 to convert the droplets 82 to plasma 88 which generates EUV radiation 84. The laser pulse 51 is directed through window (or lens) 55, and irradiates droplets 82 at the lighting point 52. The window 55 is formed in the sectional collector 60 and adopts a suitable material substantially transparent to the laser pulse 51. The droplet receptacle 35 catches and collects unused droplets 82 and/or scattered material of the droplets 82 resulting from the laser pulse 51 striking the droplets 82.

The plasma emits EUV radiation 84, which is collected by the sectional collector 60. The sectional collector 60 further reflects and focuses the EUV radiation 84 for the lithography processes performed through an exposure tool. In some embodiments, the sectional collector 60 has an optical axis 61 which is parallel to the z-axis and perpendicular to the x-axis. The sectional collector 60 includes at least two collector sections, such as collector sections 60A-60C illustrated in FIG. 1B, and described in detail with reference to FIGS. 2A-2G. The sectional collector 60 may further include a vessel wall 65 having first and second pumps 66, 68 attached thereto. In some embodiments, the first and second pumps 66, 68 include scrubbers configured to remove particulates and/or gases from the sectional collector 60. The first and second pumps 66, 68 may be collectively referred to as "the pumps 66, 68" herein.

In an embodiment, the laser generator 50 is a carbon dioxide (CO2) laser source. In some embodiments, the laser generator 50 is used to generate the laser pulse 51 with single wavelength. The laser pulse 51 is transmitted through an optic assembly for focusing and determining incident angle of the laser pulse 51. In some embodiments, the laser pulse 51 has a spot size of about 200-300 μm, such as 225 μm. The laser pulse 51 is generated to have certain driving power to meet wafer production targets, such as a throughput of 125 wafers per hour (WPH), though greater WPH may be achieved by use of the sectional collector 60 which increases throughput by its larger surface area. For example, the laser pulse 51 is equipped with about 23 kW driving power. In various embodiments, the driving power of the laser pulse 51 is at least 20 kW, such as 27 kW.

The monitoring device 70 is configured to monitor one or more conditions in the light source 70 so as to produce data for controlling configurable parameters of the light source 120. In some embodiments, the monitoring device 70 includes a metrology tool 71 and an analyzer 73. In cases where the metrology tool 71 is configured to monitor condition of the droplets 82 supplied by the droplet generator 30, the metrology tool may include an image sensor, such as a charge coupled device (CCD), complementary metal oxide semiconductor sensor (CMOS) sensor or the like. The metrology tool 71 produces a monitoring image including image or video of the droplets 82 and transmits the monitoring image to the analyzer 73. In cases where the metrology tool 71 is configured to detect energy or intensity of the EUV light 84 produced by the droplet 82 in the light source 120, the meteorology tool 71 may include a number of energy sensors. The energy sensors may be any suitable sensors that are able to observe and measure energy of electromagnetic radiation in the ultraviolet region.

The analyzer 73 is configured to analyze signals produced by the metrology tool 71 and outputs a detection signal to the controller 90 according to an analyzing result. For example, the analyzer 73 includes an image analyzer. The analyzer 73 receives the data associated with the images transmitted from the metrology tool 71 and performs an image analysis process on the images of the droplets 82 in the excitation zone. Afterwards, the analyzer 73 sends data related to the analysis to the controller 90. The analysis may include a flow path error or a position error.

In some embodiments, two or more metrology tools 71 are used to monitor different conditions of the light source 120. One is configured to monitor condition of the droplets 82 supplied by the droplet generator 30, and the other is configured to detect energy or intensity of the EUV light 84 produced by the droplet 82 in the light source 120. In some embodiments, the metrology tool 71 is a final focus module (FFM) and positioned in the laser source 50 to detect light reflected from the droplet 82.

The controller 90 is configured to control one or more elements of the light source 120. In some embodiments, the controller 90 is configured to drive the droplet generator 30 to generate the droplets 82. In addition, the controller 90 is configured to drive the laser generator 50 to fire the laser pulse 51. The generation of the laser pulse 51 may be controlled to be associated with the generation of droplets 82 by the controller 90 so as to make the laser pulse 51 hit each target 82 in sequence.

In some embodiments, the droplet generator 30 includes a reservoir 31 and a nozzle assembly 32. The reservoir 31 is configured for holding the target material 80. In some embodiments, one gas line 41 is connected to the reservoir 31 for introducing pumping gas, such as argon, from a gas source 40 into the reservoir 31. By controlling the gas flow in the gas line 41, the pressure in the reservoir 31 can be manipulated. For example, when gas is continuously supplied into the reservoir 31 via the gas line 41, the pressure in the reservoir 31 increases. As a result, the target material 80 in the reservoir 31 can be forced out of the reservoir 31 in the form of droplets 82.

Figure 2D:
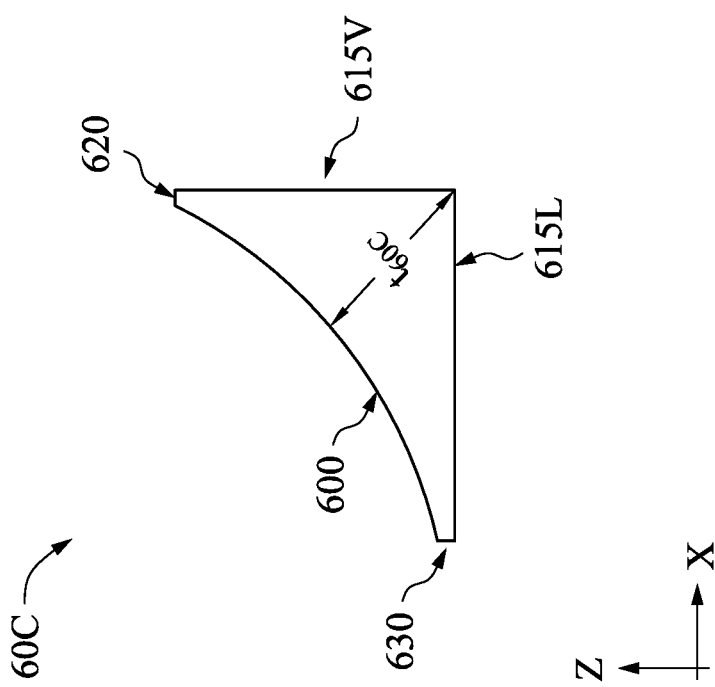
Figure 2C:
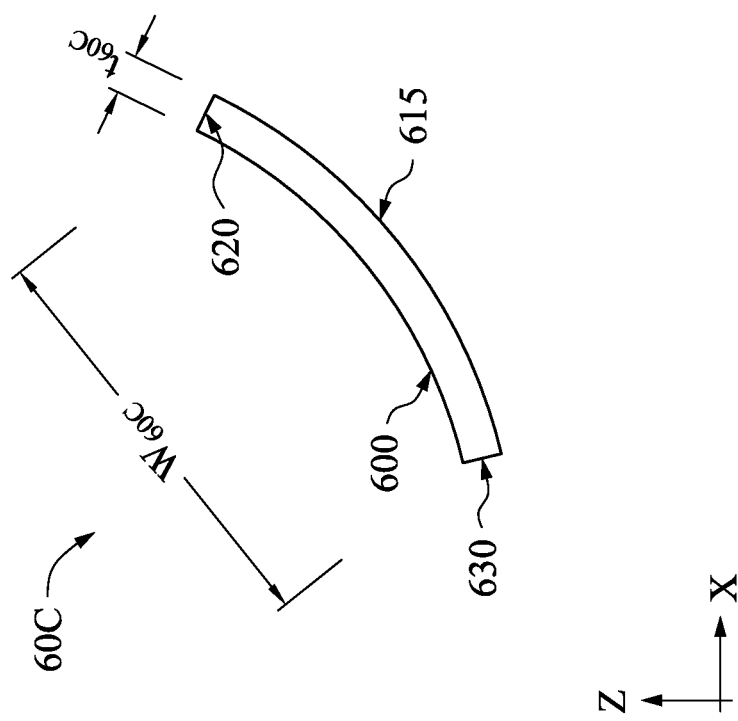
Figure 2E:
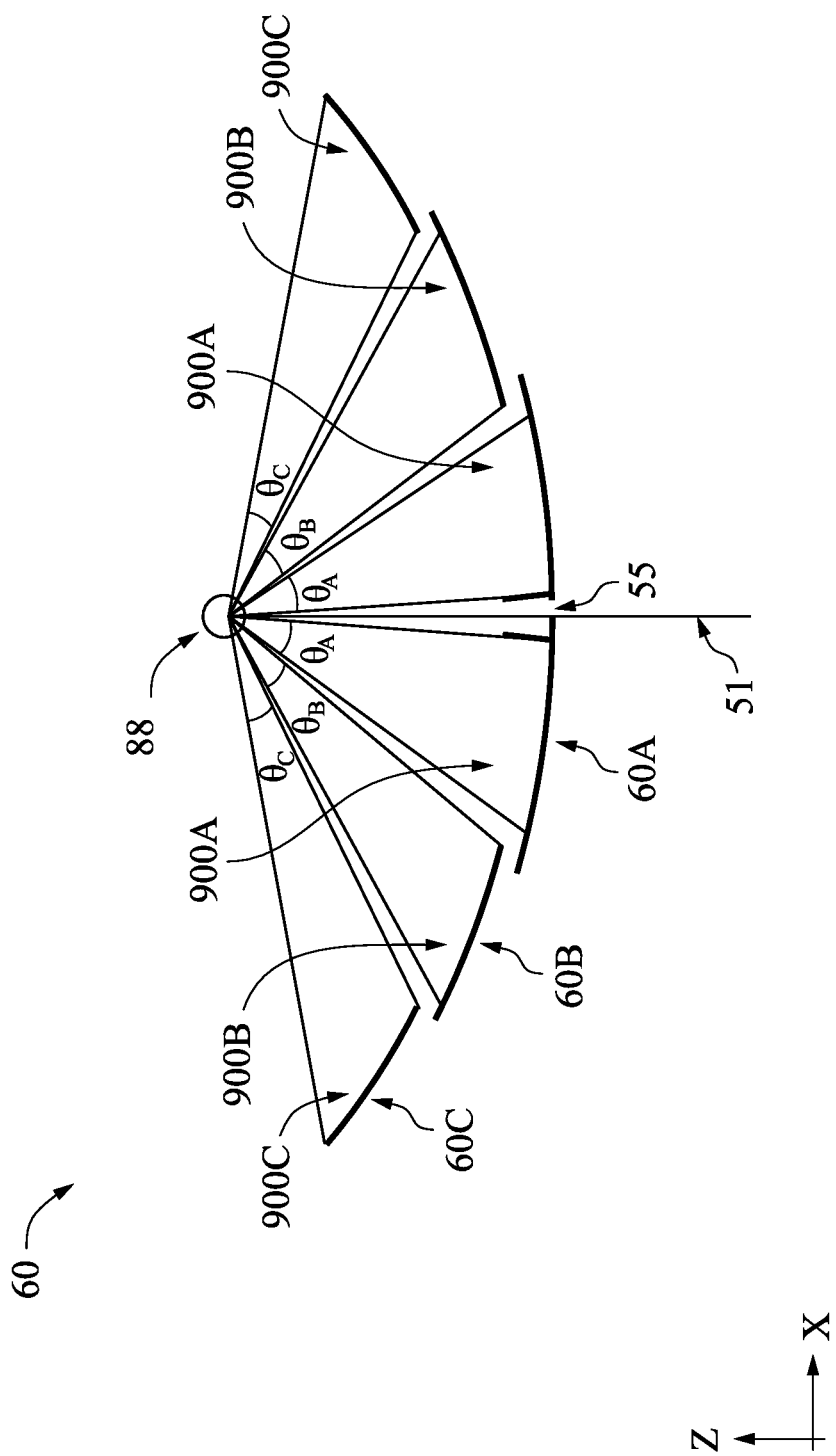
Figure 2G:
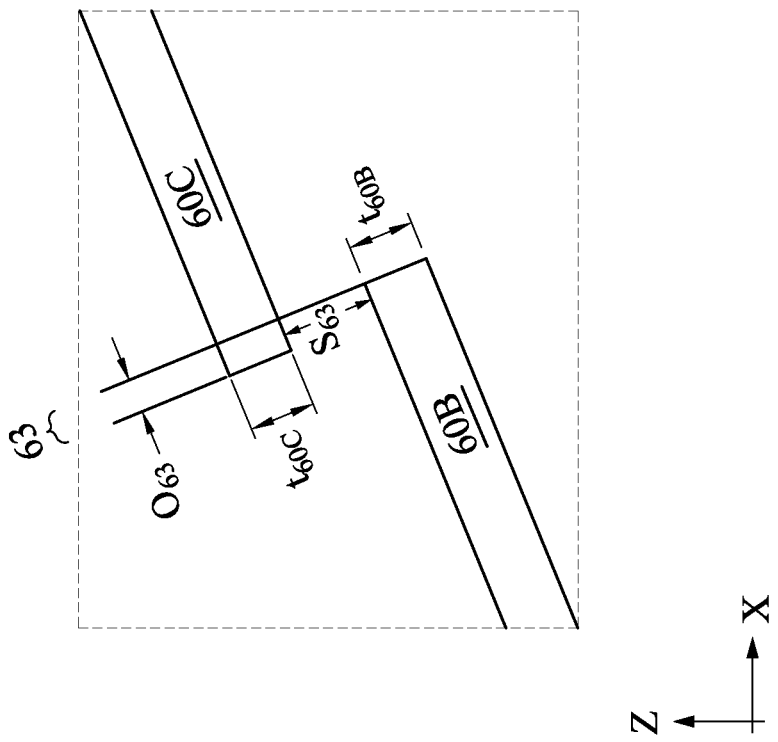
Figure 2F:
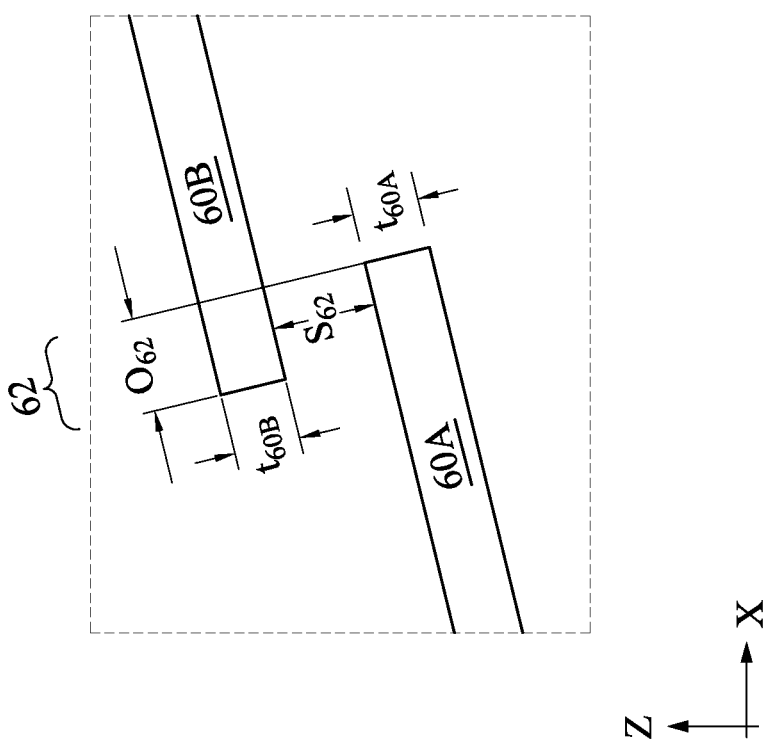
Figure 2H:
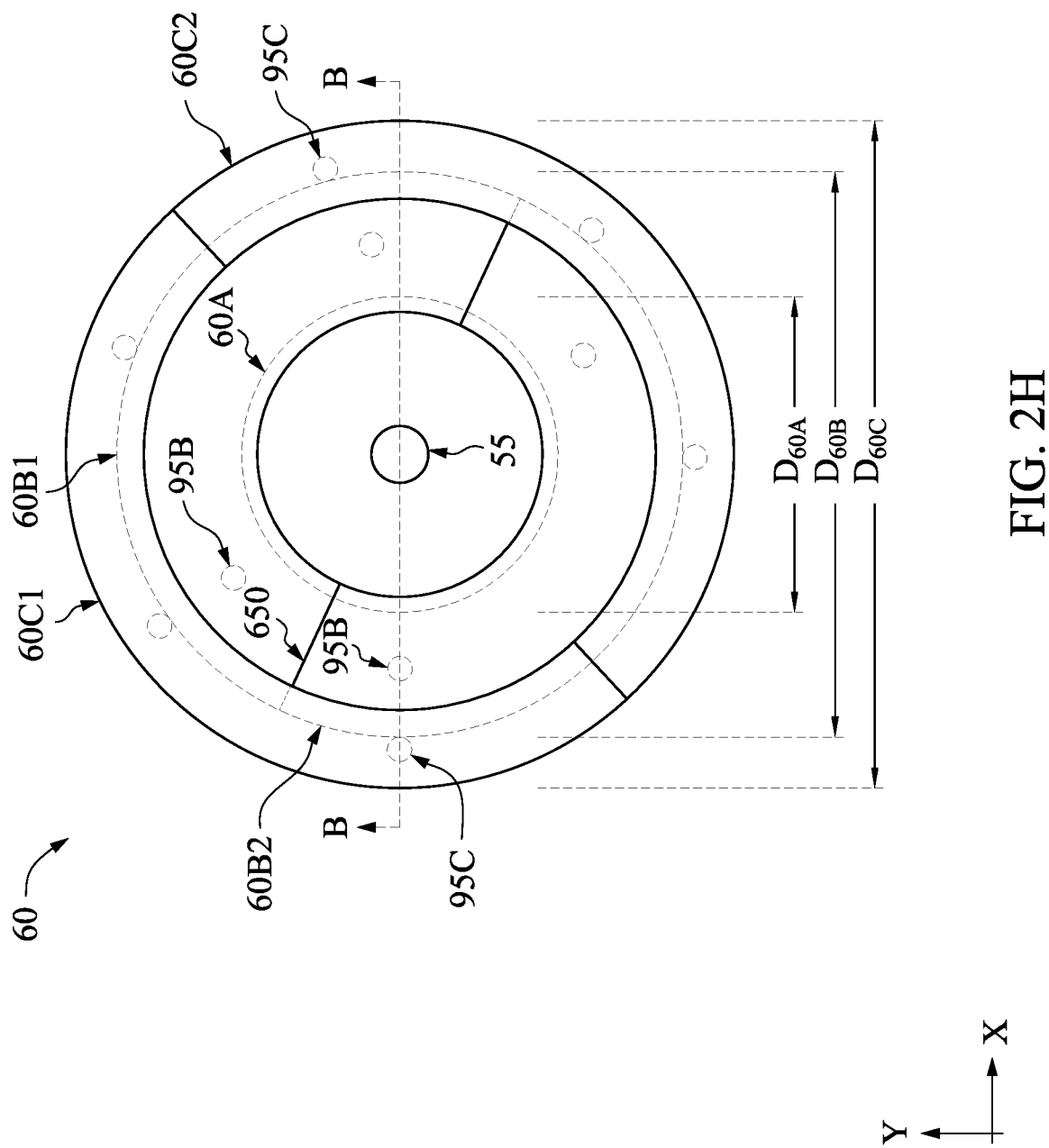

FIGS. 2A-2H are various views of the sectional collector 60 in accordance with various embodiments. FIG. 2A is a top view of the sectional collector 60. FIGS. 2B and 2E are cross-sectional views of the sectional collector 60 along the line B-B shown in FIG. 2A. FIGS. 2C and 2D are detailed views of a collector section 60C in accordance with various embodiments. FIGS. 2F and 2G are detailed views of overlap regions 62, 63 of the sectional collector 60 depicted in FIG. 2B. FIG. 2H is a top view of the sectional collector 60 including ring segments, in accordance with various embodiments.

In FIG. 2A, the sectional collector 60 is shown including three collector sections 60A, 60B, 60C. The collector section 60A is substantially mirror-polished, includes an upper portion 600 facing the droplets 82, a support portion 610 configured to support the upper portion 600, and is positioned in a central region of the sectional collector 60. In some embodiments, the upper portion 600 and the support portion 610 are monolithically formed. In some embodiments, the support portion 610 encloses and/or secures the upper portion 600, for example by clamps or other securing structure holding the outer edge of the upper portion 600.

In some embodiments, the collector section 60A includes material such as stainless steel, or the like, and may further include one or more coatings of another material, such as Ru, $ZrN/ZrO_2$ multilayers, or other suitable material for providing a mirror surface. In some embodiments, the material has Young's Modulus greater than about 200 GPa. The collector section 60A has diameter $D_{60A}$, which may be uniform for the entire collector section 60A, in some embodiments. In some other embodiments, the diameter $D_{60A}$ may be one of at least two diameters of the collector section 60A. For example, for the collector section 60A that has elliptical cross-section normal to the Z-axis, the diameter $D_{60A}$ may be a major diameter (or "major axis") or a minor diameter (or "minor axis"). In some embodiments, the diameter $D_{60A}$ is in a range of about 100 mm to about 600 mm (e.g., about 400 mm), though larger or smaller diameters may be desirable in other embodiments. The collector section 60A includes the window 55, which is substantially positioned at the center of the collector section 60A, in some embodiments. As shown in FIG. 2B, the collector section 60A further has width $W_{60A}$, which is a distance between the outer edge of the collector section 60A and the outer edge of the window 55 at the surface of the collector section 60A facing the laser generator 50. In some embodiments, the width $W_{60A}$ is substantially uniform over the entire collector section 60A. The collector section 60A is configured to reflect a first set of photons corresponding to the central region of the sectional collector which is described in further detail with reference to FIG. 2E. The collector section 60A further has thickness $t_{60A}$, which is illustrated in FIG. 2F. In some embodiments, the thickness $t_{60A}$ of the collector section 60A is substantially uniform (e.g., having variation of less than about 10%, about 5% or about 1%) across the entirety of the collector section 60A.

In some embodiments, the collector section 60A is positioned nearest the laser generator 50, and furthest the droplet 82, along the Z-axis, of the three collector sections 60A-60C. In some embodiments, the Z-axis, which is parallel to the central (or "optical") axis 61 (see FIG. 1B) of the sectional collector 60, is parallel to Earth's gravity, or perpendicular to Earth's gravity, though other orientations may also be desirable depending on, for example, position of the sectional collector 60 in the lithography system 10. Configuring the optical axis 61 of the sectional collector 60 to be perpendicular to Earth's gravity may simplify calculation of path of motion of the droplets 82, as the droplets 82 may travel in a direction generally parallel to the Earth's gravity.

The collector section 60B is substantially mirror-polished, and is positioned offset from the collector section 60A, as shown in FIG. 2B. In the orientation shown in FIG. 2B, the collector section is offset from the collector section 60A along the Z direction. The collector section 60B is positioned in a first peripheral region of the sectional collector 60. In some embodiments, the collector section 60B includes material such as stainless steel, or the like. In some embodiments, the material has Young's Modulus greater than about 200 GPa. The collector section 60B may further include one or more coatings of another material, such as Ru, $ZrN/ZrO_2$ multilayers, or other suitable material for providing a mirror surface. The collector section 60B has diameter $D_{60B}$, which may be uniform for the entire collector section 60B, in some embodiments. In some other embodiments, the diameter $D_{60B}$ may be one of at least two diameters of the collector section 60B. For example, for the collector section 60B that has elliptical cross-section normal to the Z-axis, the diameter $D_{60B}$ may be a major diameter (or "major axis") or a minor diameter (or "minor axis"). In some embodiments, the diameter $D_{60B}$ is in a range of about 200 mm to about 800 mm, though larger or smaller diameters may be desirable in other embodiments. The collector section 60B is generally ring-shaped, having an inner edge and an outer edge (outer edge is depicted in phantom in FIG. 2A), and may be substantially aligned with the center of the collector section 60A, in some embodiments. As shown in FIG. 2B, the collector section 60B further has width $W_{60B}$, which is a distance between the outer edge of the collector section 60B and the inner edge of the collector section 60B. The inner edge of the collector section 60B overlaps the outer edge of the collector section 60A in an overlap region 62 depicted in FIG. 2B, and described in detail with reference to FIG. 2F. The overlap region 62 is configured to allow flow of air or a gas into and/or from a gap between surfaces of the collector section 60B and the collector section 60A, which is described in detail with reference to FIGS. 3A-3B. In some embodiments, the width $W_{60B}$ is substantially uniform over the entire collector section 60B. The collector section 60B is configured to reflect a second set of photons corresponding to the first peripheral region of the sectional collector 60, which is described in further detail with reference to FIG. 2E. The collector section 60B further has thickness $t_{60B}$, which is illustrated in FIG. 2F and FIG. 2G. In some embodiments, the thickness $t_{60B}$ of the collector section 60B is substantially uniform (e.g., having variation of less than about 10%, about 5% or about 1%) across the entirety of the collector section 60B.

The collector section 60C is substantially mirror-polished, and is positioned offset from the collector section 60B, as shown in FIG. 2B. In the orientation shown in FIG. 2B, the collector section 60C is offset from the collector section 60B along the Z direction. The collector section 60C is positioned in a second peripheral region of the sectional collector 60. The first peripheral region is generally between the central region and the second peripheral region. In some embodiments, the collector section 60C includes material such as stainless steel, or the like. In some embodiments, the material has Young's Modulus greater than about 200 GPa. The collector section may further include one or more coatings of another material, such as Ru, $ZrN/ZrO_2$ multilayers, or other suitable material for providing a mirror surface. The collector section 60C has diameter $D_{60C}$, which may be uniform for the entire collector section 60C, in some embodiments. In some other embodiments, the diameter $D_{60C}$ may be one of at least two diameters of the collector section 60C. For example, for the collector section 60C that has elliptical cross-section normal to the Z-axis, the diameter $D_{60C}$ may be a major diameter (or "major axis") or a minor diameter (or "minor axis"). In some embodiments, the diameter $D_{60C}$ is in a range of about 300 mm to about 1000 mm, though larger or smaller diameters may be desirable in other embodiments. The collector section 60C is generally ring-shaped, having an inner edge and an outer edge (outer edge is depicted in phantom in FIG. 2A), and may be substantially aligned with the center of the collector section 60A, in some embodiments. As shown in FIG. 2B, the collector section 60C further has width $W_{60C}$, which is a distance between the outer edge of the collector section 60C and the inner edge of the collector section 60C. The inner edge of the collector section 60C overlaps the outer edge of the collector section 60B in an overlap region 63 depicted in FIG. 2B, and described in detail with reference to FIG. 2G. The overlap region 63 is configured to allow flow of air or a gas into and/or from a gap between surfaces of the collector section 60C and the collector section 60B, which is described in detail with reference to FIGS. 3A-3B. In some embodiments, the width $W_{60C}$ is substantially uniform over the entire collector section 60C. The collector section 60C is configured to reflect a third set of photons corresponding to the second peripheral region of the sectional collector 60, which is described in further detail with reference to FIG. 2E. The collector section 60C further has thickness $t_{60C}$, which is illustrated in FIG. 2G. In some embodiments, the thickness $t_{60C}$ of the collector section 60C is substantially uniform (e.g., having variation of less than about 10%, 5% or 1%) across the entirety of the collector section 60C.

In some embodiments, the width $W_{60A}$ of the collector section 60A corresponding to the central region is substantially equal to the widths $W_{60B}$, $W_{60C}$ of the collector sections 60B, 60C corresponding to the first and second peripheral regions, respectively. In some embodiments, the width $W_{60A}$ is in a range of about 50 mm to about 300 mm. In some embodiments, the widths $W_{60B}$, $W_{60C}$ are each in a range of about 50 mm to about 300 mm. In some embodiments, the widths $W_{60B}$, $W_{60C}$ are about 100 mm. In some embodiments, at least one of the widths $W_{60A}$-$W_{60C}$ is different from the other of the widths $W_{60A}$-$W_{60C}$. For example, to avoid deformation due to self-weight, it may be desirable for peripherally-located collector sections, such as the collector sections 60B, 60C, to have similar width to, or lower width than, the centrally-located collector section(s), such as the collector section 60A. In such embodiments, the width $W_{60C}$ may be less than the width $W_{60B}$, which may be less than the width $W_{60A}$. In some embodiments, either of the widths $W_{60B}$, $W_{60C}$ is less than the width W 60A by an amount in a range from about 20 mm to about 300 mm. In some embodiments, variance among the widths $W_{60A}$-$W_{60C}$ may be less than about 50%, less than about 30% or less than about 10%. Generally, if variance exists among the widths $W_{60A}$-$W_{60C}$, the width $W_{60A}$ is greater than either or both of the widths $W_{60B}$, $W_{60C}$ to avoid deformation of the collector sections 60B, 60C located more peripherally in the sectional collector 60. For example, a ratio of width $W_{60A}$ over width $W_{60B}$ or width $W_{60C}$ may be in a range of about 1 to about 1.5. A ratio of width $W_{60B}$ over width $W_{60C}$ may be in a range of about 0.7 to about 1.5, in some embodiments. In some embodiments, widths $W_{60A}$, $W_{60B}$, $W_{60C}$ may be in a ratio of about 1:0.8:0.8.

In FIG. 2C and FIG. 2D, the collector section 60C is shown as an example to illustrate cross-sectional dimensions in two configurations in accordance with various embodiments. Although the collector section 60C is shown in FIGS. 2C and 2D, the collector sections 60A and 60B may also be configured similarly. In some embodiments, at least one of the collector sections 60A-60C is configured as shown in FIG. 2C, and at least one of the collector sections 60A-60C is configured as shown in FIG. 2D.

In FIG. 2C, the collector section 60C is curved and has substantially uniform thickness $t_{60C}$ over its entire volume. In some embodiments, the thickness $t_{60C}$ is in a range of about 1 mm to about 20 mm. A first surface 600 of the collector section 60C faces the droplet 82/plasma 88, and has a curved mirror surface for reflecting the EUV radiation 84 toward the focal point 87. A second surface 615 of the collector section 60C is opposite the first surface 600, and may have substantially the same curvature as, and be parallel to, the first surface 600. A third surface 620 of the collector section 60C may be the outer edge of the collector section 60C. In some embodiments, the third surface 620 is substantially perpendicular to the first surface 600 and/or the second surface 615. A fourth surface 630 of the collector section 60C may be the inner edge of the collector section 60C. In some embodiments, the fourth surface 630 is substantially perpendicular to the first surface 600 and/or the second surface 615. In some embodiments, the third surface 620 and/or the fourth surface 630 may make an obtuse or acute angle with the first surface 600. In some embodiments, the third and fourth surfaces 620, 630 are configured to be angled corresponding to the first surface 600 in such a way as to prevent reflection of the EUV radiation 84 from the third and fourth surfaces 620, 630.

In FIG. 2D, thickness of the collector section 60C is not uniform. In the configuration shown, the collector section 60C has a substantially planar lateral second surface 615L and a substantially planar vertical second surface 615V. The lateral second surface 615 is substantially perpendicular to the vertical second surface 615V. In some embodiments, the collector section 60C of FIG. 2D includes the third and fourth surfaces 620, 630. In some other embodiments, the third and/or fourth surface 620, 630 does not exist, such that the vertical second surface 615V and/or the lateral second surface 615L makes a substantially sharp junction with the first surface 600. Increasing the thickness of the collector section 60C as shown in FIG. 2D can reduce self-weight deformation of the collector section 60C, which is generally inversely proportional to thickness of the collector section 60C. In some embodiments, the thickness $t_{60C}$ shown in FIG. 2D is maximum thickness of the collector section and may be in a range of about 1 mm to about 30 mm.

In FIG. 2B, each of the collector sections 60B-60C is adjustable in position and/or orientation by a corresponding actuator system 95B-95C, which may be referred to collectively as "actuator systems 95." The actuator system 95B contacts the collector section 60B, and the actuator system 95C contacts the collector section 60C. In some embodiments, each of the actuator systems 95B-95C may include at least three actuator modules (illustrated in phantom in FIG. 2A) to provide alignment of each collector section 60A-60C. In some embodiments, the actuator modules are ball screws or the like, for providing fine control of position of each of the collector sections 60B-60C along the z-axis. In some embodiments, the actuator systems 95 further include rotational actuators, such as tilt stages or the like, for providing fine control of angular orientation of each of the collector sections 60A-60C. Taking the collector section 60B as an example, in some embodiments, number of actuator modules attached to the collector section 60B may be determined to prevent self-deformation of the collector section 60B between actuator modules based on parameters of the collector section 60B, such as diameter $D_{60B}$, width $W_{60B}$, thickness $t_{60B}$, and material of the collector section 60B.

In some embodiments, the collector section 60A has substantially fixed position and orientation, and the collector sections 60B, 60C have adjustable position and orientation, such that no actuator system is attached to the collector section 60A. In such a configuration, the number of actuator systems 95 may be equal to one less than the number of collector sections. For example, the sectional collector 60 may include four collector sections and three actuator systems 95. Having too few actuator systems 95 may increase difficulty of aligning each collector section to focus the EUV radiation on the IF point 87. Each of the actuator modules and/or rotational actuators of the actuator systems 95B-95C may be electrically connected to and controlled by the controller 90.

Referring to FIG. 2E, the plasma 88 formed from the droplet 82 emits the EUV radiation in a non-unidirectional pattern, which may be omnidirectional in some embodiments. In some embodiments, the EUV radiation is emitted generally in a hemisphere toward the sectional collector 60, and very little EUV radiation is emitted in a hemisphere facing away from the sectional collector 60. Each of the collector sections 60A-60C of the sectional collector 60 is configured with a position and elliptical orientation to reflect a portion of the EUV radiation toward the focal point 87. In some embodiments, a number of conical regions 900A-900C corresponding to the number of collector sections 60A-60C exist, as shown in FIG. 2E. In some embodiments, the conical regions 900A-900C are non-overlapping. A central conical region 900A corresponds to the collector section 60A, and extends from a sidewall of the opening 55 to the inner edge of the collector section 60B. The central conical region 900A includes an angular region of size $\theta_A$ as depicted in FIG. 2E. A first peripheral conical region 900l3 corresponds to the collector section 60B, and extends from the inner edge of the collector section 60B to the inner edge of the collector section 60C. The first peripheral conical region 90013 includes an angular region of size $\theta_B$. A second peripheral conical region 900C corresponds to the collector section 60C, and extends from the inner edge of the collector section 60C to the outer edge of the collector section 60C. The second peripheral conical region 900C includes an angular region of size $\theta_C$. In some embodiments, the sizes $\theta_A$-$\theta_C$ are substantially equal. In some embodiments, the size $\theta_A$ is larger than the size $\theta_B$, which is in turn larger than the size $\theta_C$. This may be advantageous in configurations in which the EUV radiation is concentrated more in the central conical region 900A than in the first and/or second peripheral conical region 9006, 900C.

Based on the arrangement just described and illustrated in FIG. 2E, the collector section reflects photons from the plasma 88 in the central conical region 900A, the collector section 60B reflects photons from the plasma 88 in the first peripheral conical region 9006, and the collector section reflects photons from the plasma 88 in the second peripheral conical region 900C, each substantially to the focal point 87 (see FIG. 1B).

FIGS. 2F, 2G are detailed views of the overlap regions 62, 63 of FIG. 2B, respectively. As described above with reference to FIG. 2B, the sectional collector 60 has a hierarchical structure, in which the collector section 60A underlies the collector section 60B, which underlies the collector section 60C. The overlap regions 62, 63 provide full optical coverage, which avoids loss of photons and/or dead zones (e.g., ring-shaped zones with substantially no reflected photons) in the EUV radiation 84 collected by and emitted from the sectional collector 60.

In FIG. 2F, the overlap region 62 is a region in which the collector section 60B overlaps the collector section 60A. The overlap region 62 may have a width $O_{62}$ equal to distance between the inner edge of the collector section 60B and the outer edge of the collector section 60A. The distance may be measured as substantially tangential to the mirror surface of either/both of the collector sections 60A, 60B near the inner edge of the collector section 60B and the outer edge of the collector section 60A. The overlap region 62 may further have a gap of dimension $S_{62}$ between the collector sections 60A, 60B. The dimension $S_{62}$ may be in a range of about 1 mm to about 3 mm, in some embodiments. The dimension $S_{62}$ may be measured normal to either/both of the mirror surfaces of the collector sections 60A, 60B within the overlap region 62. The dimension $S_{62}$ being less than about 1 mm may leave insufficient space between the collector sections 60A, 60B for adjusting orientation of the collector section 60B. The dimension $S_{62}$ being greater than about 3 mm may degrade uniformity between the EUV radiation 84 impingent upon the focal point 87 from the collector section 60A and from the collector section 60B. In some embodiments, the width $O_{62}$ is in a range of about 1 mm to about 20 mm. In some embodiments, a ratio between the width $O_{62}$ and the dimension $S_{62}$ is in a range of about 0.1 to about 20.

In FIG. 2G, the overlap region 63 is a region in which the collector section 60C overlaps the collector section 60B. The overlap region 63 may have a width $O_{63}$ equal to distance between the inner edge of the collector section 60C and the outer edge of the collector section 60B. The overlap region 63 further has a gap of dimension $S_{63}$ between the collector sections 60B, 60C. Details of the width $O_{63}$ and the dimension $S_{63}$ are similar to those described with reference to width $O_{62}$ and dimension $S_{62}$ corresponding to FIG. 2F. In some embodiments, the width $O_{63}$ may be less than the width $O_{62}$, for example, due to differences in curvature between the collector sections 60A-60C. In some other embodiments, the width $O_{63}$ is substantially the same as the width $O_{62}$, or may be greater than the width $O_{62}$.

FIG. 2H is a top view of the sectional collector 60 in accordance with various embodiments. In the configuration shown in FIG. 2H, the sectional collector 60 includes two sectional dimensions, such as the vertical dimension described with reference to FIGS. 2A-2B, and a further radial dimension, as shown. In some embodiments, the collector section 60B and/or the collector section 60C each includes at least two collector segments, such as the collector segments 60131, 6062 and the collector segments 60C1, 60C2, respectively. The collector section 60B is described as an example for illustrative purposes, and the description is equally applicable for the collector section 60C. By further dividing each collector section 60B, 60C into collector segments 6061, 6062, 60C1, 60C2, increased modularity may be achieved, which may improve manufacturability and repairability. Reduced dimensions of the collector segments 6061, 6062, 60C1, 60C2 relative to dimensions of the collector sections 60B, 60C may also reduce self-deformation as strain undergone by each collector segment 6061, 6062, 60C1, 60C2 is reduced by having reduced dimensions.

In the collector section 60B shown in FIG. 2H, the collector section 60B includes two semicircular, semielliptical, or otherwise shaped collector segments 6061, 6062. In some embodiments, the collector section 60B includes three, four or more collector segments. In some embodiments, the collector segments are each of equal dimensions (e.g., diameter, width, thickness, curvature) and mass, though other configurations wherein the collector segments include different dimensions and/or mass may be desirable, as well. Each collector segment 6061, 6062 may have position and orientation determined by the actuator system 95B connected thereto. Generally, the collector segments 6061, 6062 are arranged to minimize gaps between ends of the collector segments 6061, 6062. For example, a gap 650 between an edge of the collector segment 60131 and an edge of the collector segment 6062 may be less than about 1 mm. The gap 650 being larger than about 1 mm may adversely impact uniformity of the EUV radiation 84 leaving the collector 60.

In FIGS. 2A-2H, the sectional collector 60 including collector sections 60A-60C employs a hierarchical structure to reduce surface deformation under self-weight, allowing for larger collector surface area and higher EUV radiation intensity, which improves WPD throughput due to both increased EUV radiation intensity and reduced downtime for repair. In addition to these benefits, the gaps between collector sections 60A-60C in the overlap regions 62, 63 improve air flow over the surface of the sectional collector 60, which prevents contamination of the collector sections 60A-60C, and further reduces downtime for repair, which further improves WPD throughput. Description of air flow in the sectional collector 60 is provided with reference to FIGS. 3A-3D.

FIGS. 3A, 3B illustrate air flow in the sectional collector 60 in accordance with various embodiments. FIG. 3A illustrates air flow when a positive pressure differential causes air to blow through the gaps in the overlap regions 62, 63, and FIG. 3B illustrates air flow when a negative pressure differential causes air to vent through the gaps in the overlap regions 62, 63.

In FIG. 3A, a positive pressure differential established by at least the pumps 66, 68 (FIG. 1B) causes various air flows indicated by arrows in the figure. A cone flow 310 is an air flow in generally the z-direction from the window 55 toward the focal point 87 (FIG. 1B). A perimeter flow 320 is a radial flow inward from the outer edge of the collector section 60C toward the center of the collector section e.g., toward the window 55. An umbrella flow 330 is a radial flow outward from the window 55 toward the outer edge of the collector section 60C. Due to the gaps between the collector sections 60A, 60C in the overlap regions 62, 63 and the positive pressure differential, an inward gap flow 340 is present which is a radial flow inward and upward from behind the collector sections 60A-60C toward the cone flow 310. The inward gap flow 340 increases air flow across the surfaces of the collector sections 60B, which aids in preventing contaminants (e.g., tin debris) from settling on the mirror surfaces of the collector sections 60A, 60B. In some embodiments, the air flow at the surfaces of the collector sections 60A-60C is in a range of about 50 slm to about 200 slm, such as about 90 slm. As such, downtime may be reduced due to a longer period before contaminant buildup affects yield.

In FIG. 3B, a negative pressure differential established by at least the pumps 66, 68 causes an outward gap flow 340 for taking particles (e.g., tin debris) away from the sectional collector 60 through the gaps at the overlap regions 62, 63. Other air flows are similar to those described with reference to FIG. 3A. In some embodiments, the positive and negative pressure differentials are established alternately in a repeating sequence to remove the particles effectively from the sectional collector 60 while minimizing contaminant buildup on the mirror surfaces of the collector sections 60A-60C.

Figure 3D:
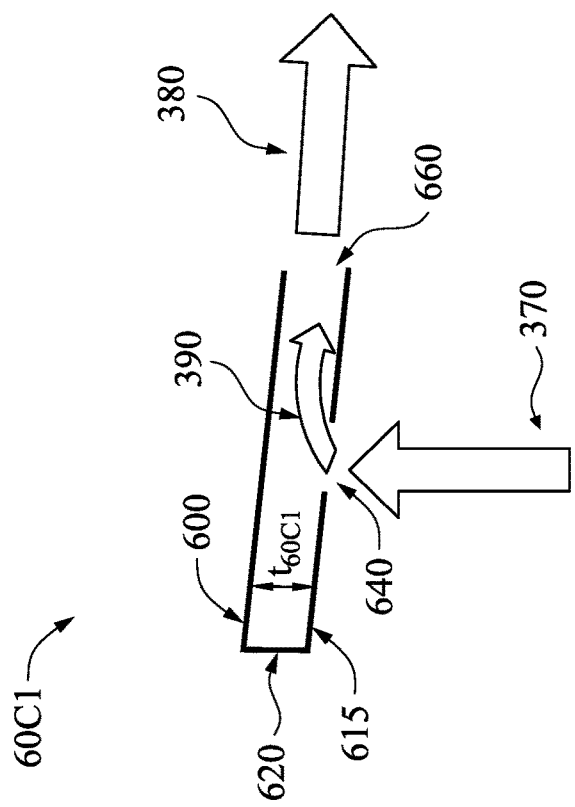
Figure 3C:
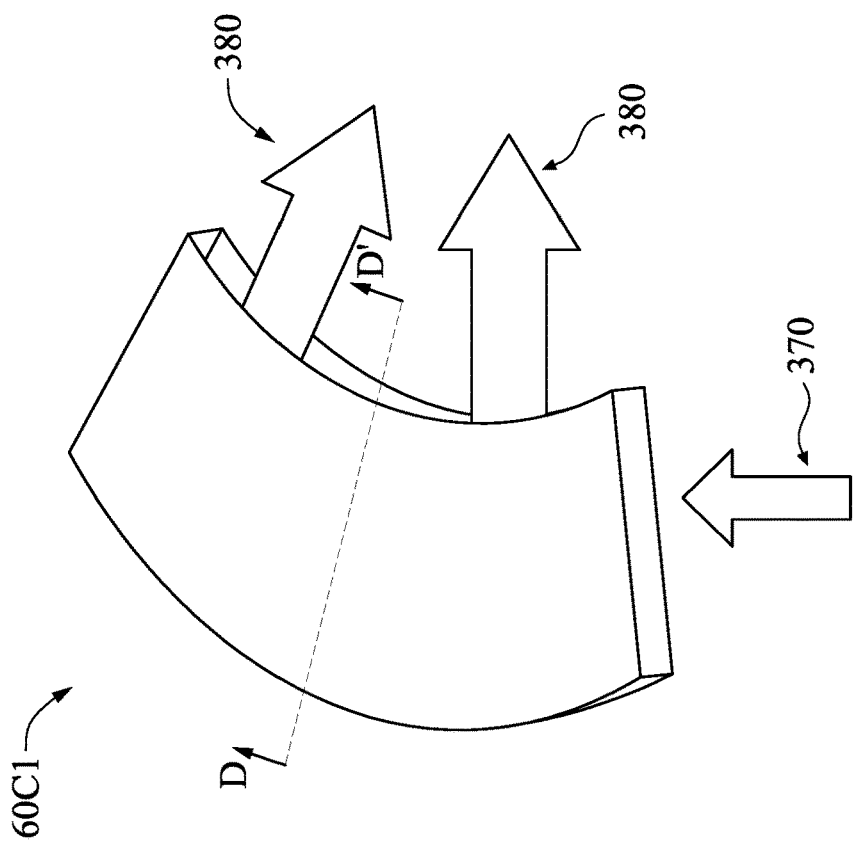
Figure 3E:
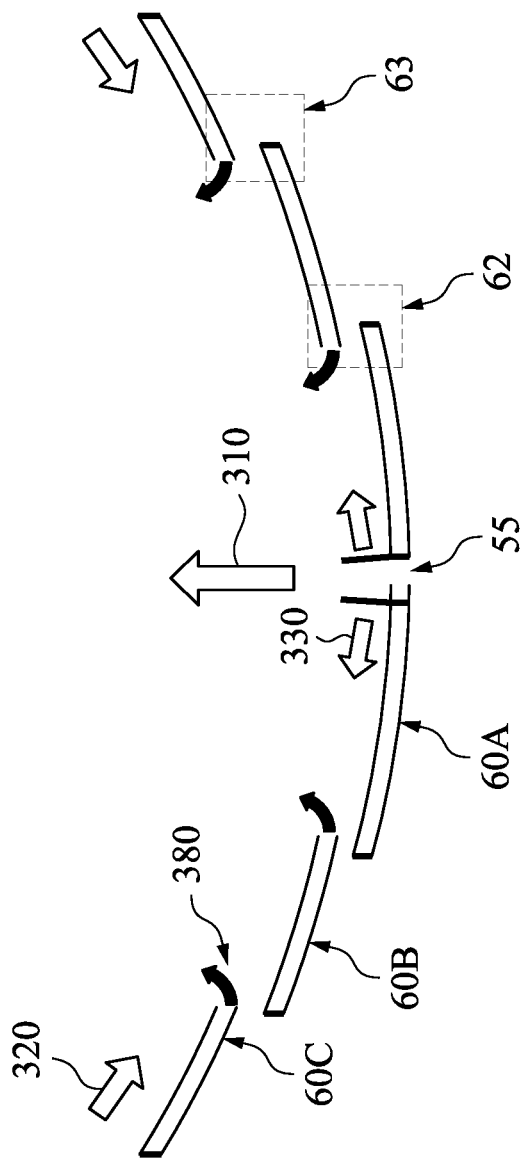

FIG. 3C and FIG. 3D are views of a collector section (e.g., the collector section 60C) or a collector segment (e.g., the collector segment 60C1, as shown) in accordance with various embodiments. FIG. 3C and FIG. 3D are described with reference to the collector segment 60C1 for purposes of illustration. FIG. 3C is a perspective view of the collector segment 60C1, and FIG. 3D is a cross-sectional view of the collector segment 60C1 along the line D-D' of FIG. 3C. FIG. 3E is a view of the sectional collector 60 illustrating air flow in accordance with various embodiments.

In some embodiments, one or more of the collector segments of at least one of the collector sections 60B, 60C, such as the collector segment 60C1, is hollow (e.g., includes a cavity) and has a first opening 640 and a second opening 660, as shown in FIG. 3C and FIG. 3D. The first opening 640 may be located in the second surface 615 (described with reference to FIG. 2C), and the second opening 660 may be located in, or replace, the fourth surface 630 (see FIG. 2C). The first opening 640 is in fluid communication with the second opening 660. Flow of air through the collector segment 60C1 is shown as first, second, and third air flows 370, 380, 390. The first air flow 370 is shown in FIG. 3D, which enters the first opening 640. The second air flow 380 exits the second opening 660 toward the center of the sectional collector 60. The third air flow 390 flows through the collector segment 60C1 from the first opening 640 toward the second opening 660. The second air flow 380 increases air flow across the surfaces of the sectional collector 60, as shown in FIG. 3E, which aids in preventing buildup of contaminants (e.g., tin debris) on the surfaces of the sectional collector 60.

Figure 4:
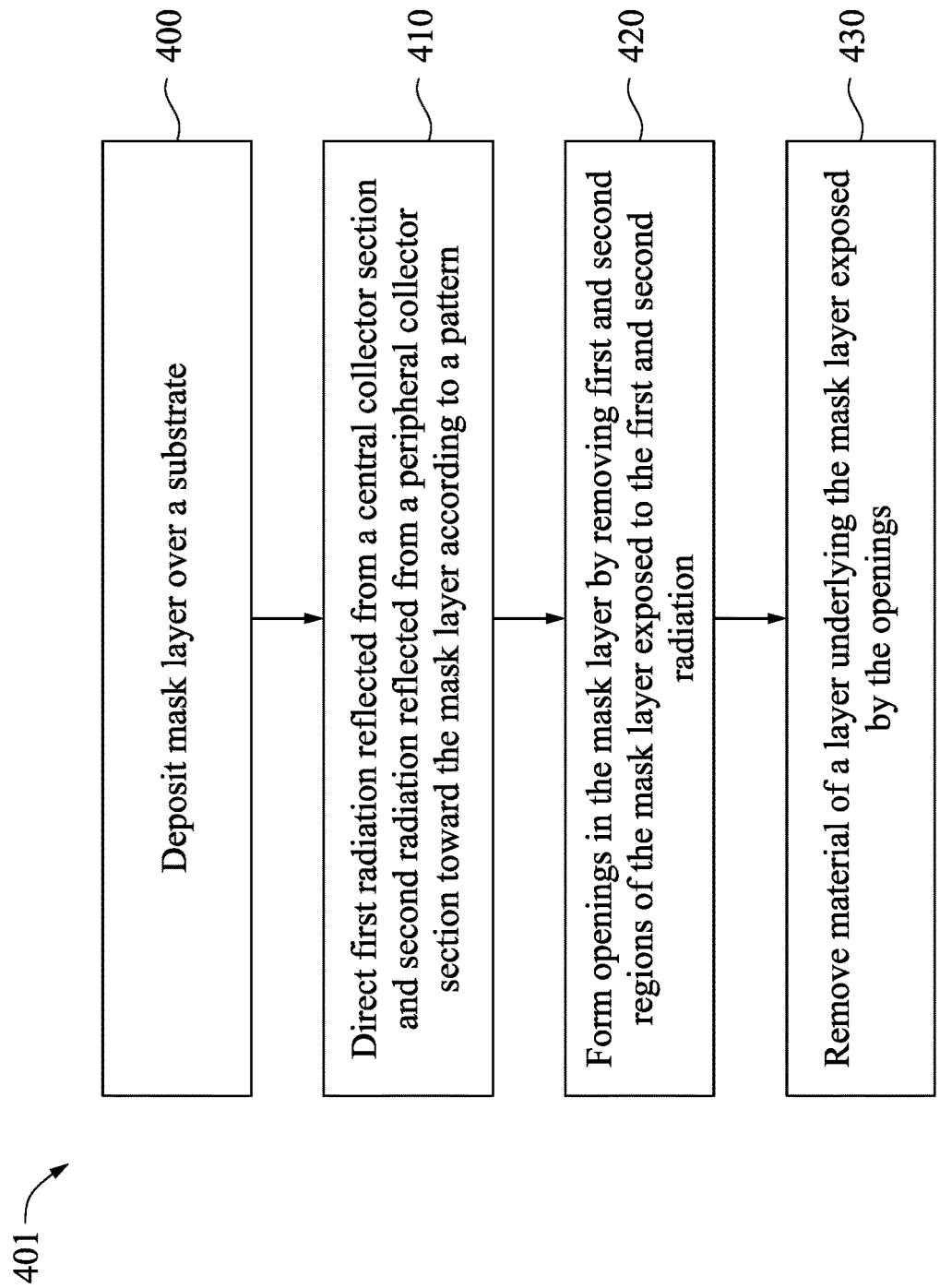

FIG. 4 is a flowchart of a process 401 for forming a device in accordance with various embodiments. In some embodiments, the process 401 for forming the device includes a number of operations (400, 410, 420 and 430). The process 401 for forming the device will be further described according to one or more embodiments. It should be noted that the operations of the process 401 may be rearranged or otherwise modified within the scope of the various aspects. It should further be noted that additional processes may be provided before, during, and after the process 401, and that some other processes may be only briefly described herein. In some embodiments, the process 401 is performed by the lithography exposure system 10 described in FIGS. 1A-3E.

In operation 400, a mask layer is deposited over a substrate. In some embodiments, the mask layer includes a photoresist layer that is sensitive to the EUV radiation 84. In some embodiments, the substrate is a semiconductor substrate, such as the semiconductor wafer 22 (see FIG. 1A). In some embodiments, the substrate is a layer overlying the semiconductor substrate, such as a dielectric layer, a metal layer, a hard mask layer, or other suitable layer. In some embodiments, the mask layer is deposited by spin coating or other suitable process.

In operation 410, first radiation is reflected from a central collector section (e.g., the collector section 60A), and second radiation is reflected from a first peripheral collector section (e.g., the collector section 60B). The first and second radiation are reflected along an optical path between the sectional collector 60 and the mask layer, which may be on the semiconductor wafer 22. In some embodiments, the first and second radiation are reflected according to a pattern, such as exists on the mask 18, which may be a reflective mask. In some embodiments, third radiation is further reflected from a second peripheral collector section (e.g., the collector section 60C), may be reflected along the optical path, and may be reflected according to the pattern. The first, second, and third radiation may be EUV radiation, and may correspond to the regions 900A-900C shown in FIG. 2E. In some embodiments, the first peripheral collector section overlaps the central collector section, and is separated from the central collector section by a first gap (e.g., as shown in FIG. 2F). In some embodiments, the second peripheral collector section overlaps the first peripheral collector section, and is separated from the first peripheral collector section by a second gap (e.g., as shown in FIG. 2G).

In operation 420, openings are formed in the mask layer by removing first regions of the mask layer exposed to the first radiation and second regions of the mask layer exposed to the second radiation. In some other embodiments, the openings are formed by removing regions of the mask layer not exposed to the first radiation or the second radiation. In some embodiments, operation 420 further includes removing third regions of the mask layer exposed to the third radiation, or removing regions of the mask layer not exposed to the first, second or third radiation.

In operation 430, material of a layer underlying the mask layer is removed. The material removed is in regions of the layer exposed by the openings in the mask layer. In some embodiments, the layer is a dielectric layer, a semiconductor layer, or other layer.

Figure 5:
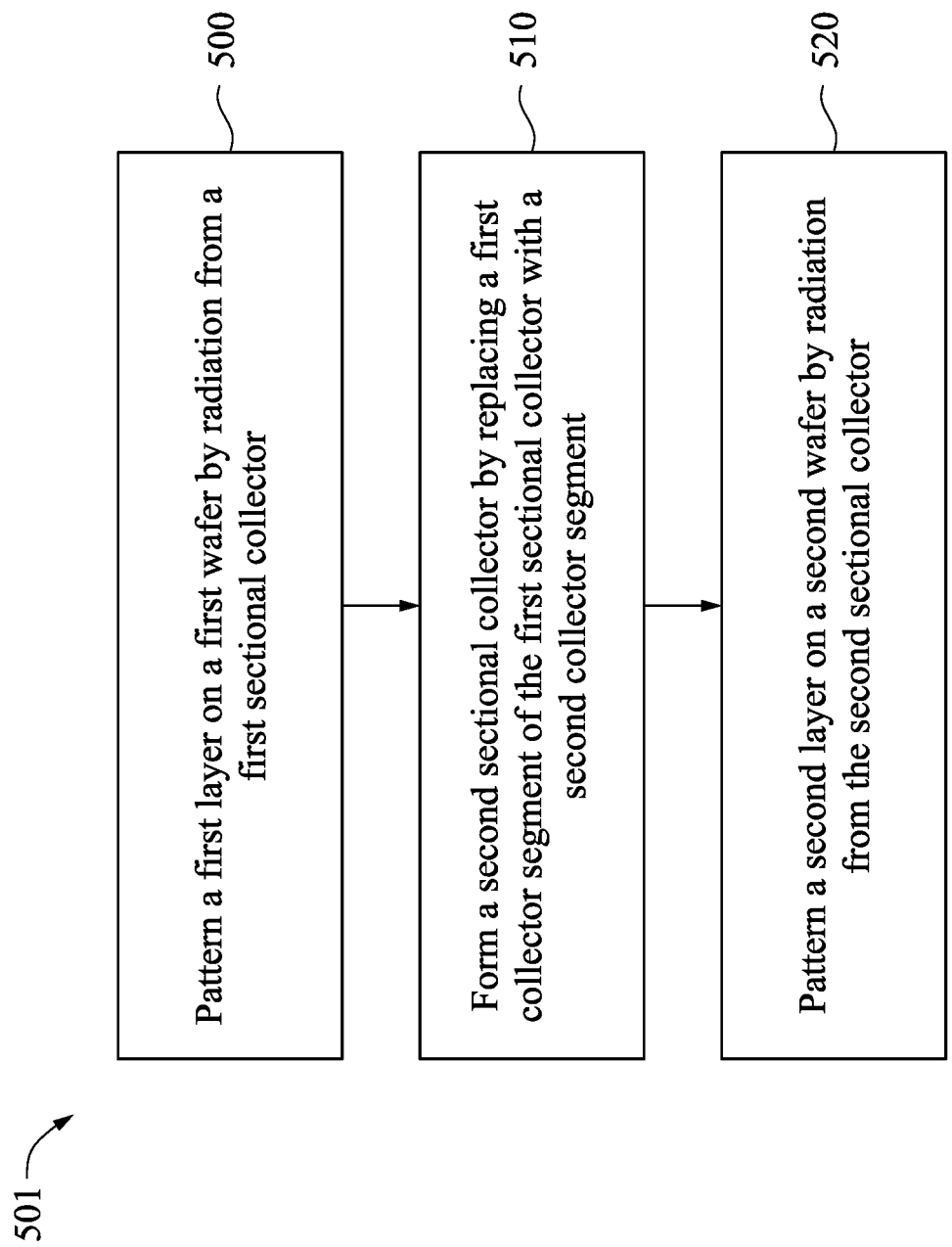

FIG. 5 is a flowchart of a process 501 for forming a device in accordance with various embodiments. In some embodiments, the process 501 for forming the device includes a number of operations (500, 510 and 520). The process 501 for forming the device will be further described according to one or more embodiments. It should be noted that the operations of the process 501 may be rearranged or otherwise modified within the scope of the various aspects. It should further be noted that additional processes may be provided before, during, and after the process 501, and that some other processes may be only briefly described herein. In some embodiments, the process 501 is performed by the lithography exposure system 10 described in FIGS. 1A-3E.

In operation 500, a first layer of a first wafer is patterned by radiation from a first sectional collector. In some embodiments, the first sectional collector is any of the sectional collectors 60 shown in FIGS. 1A-3E. In some embodiments, the first wafer is the semiconductor wafer 22 shown in FIG. 1A, and the first layer is a photoresist layer on the semiconductor wafer 22. In some embodiments, the radiation is the EUV radiation 84 reflected by the sectional collector 60. In some embodiments, the patterning includes reflecting the EUV radiation 84 by a mask, such as the mask 18 (FIG. 1A), and projecting the reflected EUV radiation onto the first layer by the POB 130.

In operation 510, a second sectional collector is formed by replacing at least one first collector segment of the first sectional collector with an equal number of corresponding second collector segments. In some embodiments, the first collector segment is a collector section, such as the collector section 60B or the collector section 60C of FIG. 2A. In some embodiments, the first collector segment is a collector segment, such as any of the collector segments 60131, 6062, 60C1, 60C2 shown in FIG. 2H.

In some embodiments, the replacement includes removing a collector section or segment based on a threshold condition. For example, the threshold condition may include a deformation threshold based on an unacceptable level of self-weight deformation of the collector section or segment, such that the first collector segment is replaced after exceeding the deformation threshold. In some embodiments, the deformation threshold is a numerical deformation condition, such as greater than about 0.5 mm, greater than about 1 mm, or the like. In some embodiments, the deformation threshold is a percentage deformation condition, such as greater than about 1%, greater than about 5%, or the like.

The threshold condition may include a cleanliness condition based on an unacceptable level of contamination, such as tin debris buildup, on the collector section or segment. In some embodiments, the cleanliness condition is a contamination condition. In some embodiments, the contamination condition includes a percentage contamination condition, such as surface area of the mirror-surface of the first collector segment including contamination greater than about 1%, greater than about 5%, or another suitable percentage condition. In some embodiments, the contamination condition includes a reflectivity condition, such as reflectivity of the first collector segment being less than about 95% of original reflectivity, less than about 90% of the original reflectivity, or another suitable reflectivity condition. In some embodiments, the original reflectivity is reflectivity of the first collector segment immediately preceding or following installation into the sectional collector 60.

The threshold condition may include a scheduling threshold. For example, the scheduling threshold may include a period of time since installation of the collector section or segment, such as greater than about 14 days, greater than about one month, or another suitable period of time. The scheduling threshold may include total runtime since installation of the collector section or segment, such as greater than about 12 days, greater than about 3 weeks, or another suitable total runtime. The scheduling threshold may include a number of wafers processed since installation of the collector section or segment, such as greater than about 10,000 wafers, greater than about 100,000 wafers, or another suitable number of wafers.

The second collector segment(s) may have substantially identical physical characteristics (shape, mass, material, surface roughness) as the first collector segment in its original form (e.g., prior to warpage or contamination). The second collector segment(s) may be installed by first removing the first collector segment(s), then attaching the second collector segments(s) in place of the removed first collector segment(s). In some embodiments, a calibration operation is performed following replacement of the first collector segment(s) with the second collector segment(s). The calibration operation may include adjusting position and/or orientation of the second collector segment(s) by the actuator systems 95.

In operation 520, a second layer on a second wafer is patterned by radiation from the second sectional collector. In some embodiments, the second wafer is a semiconductor wafer similar to the semiconductor wafer 22 shown in FIG. 1A, and the second layer is a photoresist layer on the second wafer. In some embodiments, the radiation is EUV radiation similar to the EUV radiation 84 reflected by the sectional collector 60 following replacement of the collector section(s) or collector segment(s). In some embodiments, the patterning includes reflecting the EUV radiation by a mask, either the mask 18 (FIG. 1A) or a second mask including a pattern different from the mask 18, and projecting the reflected EUV radiation onto the second layer by the POB 130.

Embodiments may provide advantages. Each of the sectional collectors 60A-60C may have a different elliptical surface to focus the EUV light on the same focal point 87 (also referred to as the "intermediate focal (IF) point;" see FIG. 1B). Use of the hierarchical structure reduces surface deformation under self-weight, as each of the collector sections 60A-60C may have significantly lower mass and smaller dimensions than a monolithic collector of similar dimensions (e.g., the diameter $D_{60C}$) would have. The hierarchical structure further provides the advantage of modularity. If any one of the collector sections 60A-60C is defective, deformed or overly contaminated, the defective, deformed or contaminated collector sections may be replaced without replacing the entire collector, which is an advantage over the monolithic collector of similar dimensions. The sectional collector 60 is also protected from contamination by the target material (e.g., Sn) by the additional flow of air/gas through the gaps in the overlap regions 62, 63, which decreases downtime that would be associated with repair of the collector, as described with reference to FIGS. 3A-3B.

In accordance with at least one embodiment, a method includes: depositing a mask layer over a substrate; directing first radiation reflected from a central collector section of a sectional collector of a lithography system toward the mask layer according to a pattern; directing second radiation reflected from a peripheral collector section of the sectional collector toward the mask layer according to the pattern, wherein the peripheral collector section is vertically separated from the central collector section by a gap; forming openings in the mask layer by removing first regions of the mask layer exposed to the first radiation and second regions of the mask layer exposed to the second radiation; and removing material of a layer underlying the mask layer exposed by the openings.

In accordance with at least one embodiment, a method includes: patterning a first layer on a first wafer by first radiation from a first sectional collector; forming a second sectional collector by replacing a first collector segment of the first sectional collector with a second collector segment; and patterning a second layer on a second wafer by second radiation from the second sectional collector.

In accordance with at least one embodiment, a lithography system includes a wafer stage, projection optics, a mask stage, illumination optics, and a light source. The wafer stage is configured to support a wafer. The projection optics are configured to direct patterned radiation onto a region of the wafer. The mask stage is configured to form and direct the patterned radiation to the projection optics. The illumination optics are configured to direct unpatterned radiation to the mask stage. The light source includes a droplet generator configured to generate a droplet, a laser source configured to emit at least one laser pulse toward the droplet, and a sectional collector configured to reflect radiation generated by the droplet toward the illumination optics. The sectional collector includes a central collector section configured to reflect a first portion of the radiation, and a first peripheral collector section configured to reflect a second portion of the radiation. The first peripheral collector section overlaps the central collector section in an overlap region. The overlap region includes a vertical gap between the first peripheral collector section and the central collector section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography system, comprising:
projection optics configured to direct patterned radiation onto a region of the wafer;
a mask stage configured to form and direct the patterned radiation to the projection optics;
illumination optics configured to direct unpatterned radiation to the mask stage; and
a light source comprising:
  a sectional collector configured to reflect radiation generated by a droplet toward the illumination optics, the sectional collector including:
  a central collector section configured to reflect a first portion of the radiation; and
  a first peripheral collector section configured to reflect a second portion of the radiation, the first peripheral collector section is vertically separated from the central collector section by a vertical gap, the first peripheral collector section further comprising:
  a first surface configured to reflect radiation toward a focal point, the first surface being free of openings;
  a second surface opposite the first surface and having substantially the same curvature as the first surface;
  a third surface forming an outer edge of the first peripheral collector section and being substantially perpendicular to the first and second surfaces;
  a hollow cavity formed within the first peripheral collector section;
  a first opening located in the second surface; and
  a second opening located opposite the third surface and adjacent to an inner edge of the first peripheral collector section, wherein the first opening, the hollow cavity, and the second opening are in fluid communication to define an airflow path through the first peripheral collector section.

2. The lithography system of claim 1, wherein the first peripheral collector section overlaps the central collector section in first overlap region, the first overlap region including the vertical gap, the sectional collector further includes a second peripheral collector section overlapping the first peripheral collector section in a second overlap region.

3. The lithography system of claim 1, wherein the vertical gap is in a range of about 1 millimeter to about 3 millimeters.

4. The lithography system of claim 1, wherein the first peripheral collector section is substantially ring-shaped with a width in a range of about 50 millimeters to about 300 millimeters.

5. The lithography system of claim 1, wherein the first peripheral collector section includes a first collector segment and a second collector segment separated by at least one lateral gap.

6. The lithography system of claim 1, wherein the sectional collector further includes a second peripheral collector section overlapping the first peripheral collector section in a second overlap region, the second overlap region including a second vertical gap between the second peripheral collector section and the first peripheral collector section.

7. The lithography system of claim 1 wherein the second opening faces toward the center of the sectional collector.

8. A lithography system, comprising:
a wafer stage configured to support a wafer;
projection optics configured to direct patterned radiation onto a region of the wafer;
a mask stage configured to form and direct the patterned radiation to the projection optics;
illumination optics configured to direct unpatterned radiation to the mask stage; and
a light source comprising:
  a droplet generator configured to generate a droplet;
  a laser source configured to emit at least one laser pulse toward the droplet; and
  a sectional collector configured to reflect radiation generated by the droplet toward the illumination optics, the sectional collector including:
  a central collector section configured to reflect a first portion of the radiation; and
  a first peripheral collector section configured to reflect a second portion of the radiation, the first peripheral collector section overlapping the central collector section in an overlap region, the overlap region including a vertical gap between the first peripheral collector section and the central collector section, and the first peripheral collector section further comprising:
  a first surface configured to reflect radiation toward a focal point, the first surface being free of openings;
  a second surface opposite the first surface and having substantially the same curvature as the first surface;
  a third surface forming an outer edge of the first peripheral collector section and being substantially perpendicular to the first and second surfaces;
  a hollow cavity formed within the first peripheral collector section;
  a first opening located in the second surface; and
  a second opening located opposite the third surface and adjacent to an inner edge of the first peripheral collector section, wherein the first opening, the hollow cavity, and the second opening are in fluid communication to define an airflow path through the first peripheral collector section.

9. The lithography system of claim 8, wherein the sectional collector further includes a second peripheral collector section overlapping the first peripheral collector section in a second overlap region, the second overlap region including a second vertical gap between the second peripheral collector section and the first peripheral collector section.

10. The lithography system of claim 8, wherein the vertical gap is in a range of about 1 millimeter to about 3 millimeters.

11. The lithography system of claim 8, wherein the first peripheral collector section is substantially ring-shaped with a width in a range of about 50 millimeters to about 300 millimeters.

12. The lithography system of claim 8, wherein the first peripheral collector section includes a first collector segment and a second collector segment separated by at least one lateral gap.

13. The lithography system of claim 8, wherein the second opening of the first peripheral collector section faces toward the center of the sectional collector.

14. A lithography system, comprising:
   a light source comprising:
      a droplet generator configured to generate a droplet;
      a laser source configured to emit at least one laser pulse toward the droplet; and
      a sectional collector configured to reflect radiation generated by the droplet toward illumination optics, the sectional collector including:
         a central collector section configured to reflect a first portion of the radiation; and
         a first peripheral collector section configured to reflect a second portion of the radiation, the first peripheral collector section overlapping the central collector section in an overlap region, the overlap region including a vertical gap between the first peripheral collector section and the central collector section, the first peripheral collector section further comprising:
         a first surface configured to reflect radiation toward a focal point, the first surface being free of openings;
         a second surface opposite the first surface and having substantially the same curvature as the first surface;
         a third surface forming an outer edge of the first peripheral collector section and being substantially perpendicular to the first and second surfaces;
         a hollow cavity formed within the first peripheral collector section;
         a first opening located in the second surface; and
         a second opening located opposite the third surface and adjacent to an inner edge of the first peripheral collector section, wherein the first opening, the hollow cavity, and the second opening are in fluid communication to define an airflow path through the first peripheral collector section.

15. The lithography system of claim 14, wherein the sectional collector further includes a second peripheral collector section overlapping the first peripheral collector section in a second overlap region, the second overlap region including a second vertical gap between the second peripheral collector section and the first peripheral collector section.

16. The lithography system of claim 14, wherein the vertical gap is in a range of about 1 millimeter to about 3 millimeters.

17. The lithography system of claim 14, wherein the first peripheral collector section is substantially ring-shaped with a width in a range of about 50 millimeters to about 300 millimeters.

18. The lithography system of claim 14, wherein the first peripheral collector section includes a first collector segment and a second collector segment separated by at least one lateral gap.

19. The lithography system of claim 14, wherein the sectional collector further includes a second peripheral collector section overlapping the first peripheral collector section in a second overlap region.

20. The lithography system of claim 14, wherein the second opening faces toward the center of the sectional collector.

* * * * *